United States Patent
Hwang et al.

(10) Patent No.: US 8,022,473 B2
(45) Date of Patent: *Sep. 20, 2011

(54) SEMICONDUCTOR DEVICE HAVING REDUCED SUB-THRESHOLD LEAKAGE

(75) Inventors: David K. Hwang, Boise, ID (US); Larson Lindholm, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/029,038

(22) Filed: Feb. 16, 2011

(65) Prior Publication Data

US 2011/0133263 A1 Jun. 9, 2011

Related U.S. Application Data

(60) Division of application No. 12/724,196, filed on Mar. 15, 2010, now Pat. No. 7,897,465, which is a continuation of application No. 11/805,102, filed on May 21, 2007, now Pat. No. 7,696,568.

(51) Int. Cl.
*H01L 29/66* (2006.01)
*H01L 21/336* (2006.01)

(52) U.S. Cl. .................... 257/330; 438/272
(58) Field of Classification Search ............... 438/272, 438/426; 257/330, E21.428
See application file for complete search history.

(56) References Cited

U.S. PATENT DOCUMENTS

| 7,442,618 B2 | 10/2008 | Chong et al. .......... 438/424 |
| 7,470,588 B2 | 12/2008 | Cho et al. ............ 438/272 |
| 7,696,568 B2 * | 4/2010 | Hwang et al. ......... 257/330 |

* cited by examiner

*Primary Examiner* — Calvin Lee
(74) *Attorney, Agent, or Firm* — Dorsey & Whitney LLP

(57) ABSTRACT

A semiconductor device fabricated in the semiconductor substrate includes a FinFET transistor having opposed source and drain pillars, and a fin interposed between the source and drain pillars. A cavity is formed in the semiconductor substrate extending at least partially between the fin and the semiconductor substrate. The cavity may be formed within a shallow trench isolation structure, and it may also extend at least partially between the semiconductor substrate and one or both of the pillars. The cavities increase the impedance between the semiconductor substrate and the fin and/or pillars to decrease the sub-threshold leakage of the FinFET transistor.

19 Claims, 5 Drawing Sheets

US 8,022,473 B2

SEMICONDUCTOR DEVICE HAVING REDUCED SUB-THRESHOLD LEAKAGE

CROSS-REFERENCE TO RELATED APPLICATION

This application is a divisional of U.S. Patent Application Ser. No. 12/724,196, filed Mar. 15, 2010, U.S. Pat. No. 7,897,465, which is a continuation of U.S. Patent Application Ser. No. 11/805,102, filed May 21, 2007, U.S. Pat. No. 7,696,568. These applications and patents are incorporated by reference herein in their entirety and for all purposes.

TECHNICAL FIELD

This invention relates generally to integrated circuit devices, and, more particularly, to improved vertical transistor structures and a method of making such transistor structures.

BACKGROUND OF THE INVENTION

Conventional semiconductor electronic storage devices, such as Dynamic Random Access Memory ("DRAM") devices, typically incorporate capacitor and transistor structures in which memory cell capacitors temporarily store data based on the charged state of the capacitors. When data bits are to be written to or read from the memory cells, the memory cell capacitors are selectively coupled to digit lines through respective access transistors.

There is an ever-present desire in the semiconductor fabrication industry, in general, and the memory industry, specifically, to achieve individual devices with smaller physical dimensions. Reducing the dimensions, a process known as "scaling," is desirable in order to increase the number of individual devices that can be placed on a given area of semiconductor material thereby reducing the unit cost and the power consumption of individual devices. In addition, scaling can result in performance increases of the individual devices as the charge carriers, having a finite velocity, have a shorter distance to travel, and they provide less bulk material for charge to accumulate or dissipate.

One method of designing smaller memory cells is to use vertical transistors, such as fin field effect transistor ("Fin-FET") devices. A FinFET device employs a vertically arranged structure or fin interposed between the source and drain where the channel is defined, typically with a multi-gate configuration. The advantages of the FinFET architecture include the ability to define device dimensions smaller than the photolithographic limit and the ability to easily access opposed sides of the channel to achieve a multi-gate structure. Such a multi-gate arrangement can provide superior control over the gate of the device. A fully depleted silicon fin can be achieved with very low doping levels in the active region.

With reference to FIG. 1, a FinFET device 10 typically includes a fin 14 extending between a vertically oriented drain pillar 18 and a vertically oriented source pillar 20. The fin 14, drain pillar 18 and source pillar 20 are fabricated in a body 22 of semiconductor material. Gates 24 are fabricated on each side of the fin 14, although only one gate 24 is shown in FIG. 1.

A prior art structure for using FinFET devices 10 used as a DRAM access transistor is shown in FIG. 2. The drain pillar 18 is common to two FinFET devices 30, 32. The source pillar 20 of the first FinFET device 30 is separated from the source pillar 20 of a third FinFET device 36 through a shallow trench isolation (STI") structure 40 fabricated in the body 22. The STI structure 40 electrically isolates the source pillar 20 of the FinFET device 30 from the source pillar 20 of the FinFET device 36. Similarly, the source pillar 20 of the second FinFET device 32 is isolated from the source pillar 20 of a fourth FinFET device 44 by a STI structure 48. The drain pillar 18 is common to two FinFET devices 30, 32, and it is connected to a common digit line 26. The source pillars 20 of the FinFET devices 30, 32, 36, 44 are connected to respective memory cell capacitors 28.

Although scaling memory devices, such as DRAMs, provide the advantages of reducing cost and power consumption, scaling is not without its performance drawbacks. In particular, scaling can increase sub-threshold leakage between the drain pillar 18 and source pillar 20. In some applications, sub-threshold leakage does not present any problems in the use of FinFET devices. However, in other applications, such as for use as access transistors, sub-threshold leakage can significantly degrade the performance of DRAM devices. The length of time that memory cell capacitors can store charge is greatly effected by the amount of sub-threshold leakage through the respective access transistors to which they are connected. Shorter charge retention times require that the memory cells be refreshed more frequently. However, refreshing memory cells consumes a significant amount of power. Therefore, excessive sub-threshold leakage of access transistors can greatly increase the amount of power consumed by DRAM devices. Furthermore, if the sub-threshold leakage is large enough, it can result in data retention errors.

A primary cause of sub-threshold leakage in FinFET devices arises from the structure that is typically used for FinFET devices. In particular, the fin 14 is connected to the body 22 of semiconductor material in which the FinFET device 10 is fabricated, which can serve as a current leakage path from a memory cell capacitor connected to the source pillar 20. This current leakage path can seriously limit the use of FinFET devices 10 for DRAM access transistors. There can also be sub-threshold leakage from the source pillar 20 directly to the body 22 and from the drain pillar 18 directly to the body. However, this leakage is of a lesser magnitude and is thus less of a problem than leakage from the fin 14 to the body 22.

There is therefore a need for a FinFET structure that reduces the sub-threshold leakage of FinFET devices, particularly between the fin and body of such devices.

DETAILED DESCRIPTION

Figure 1:
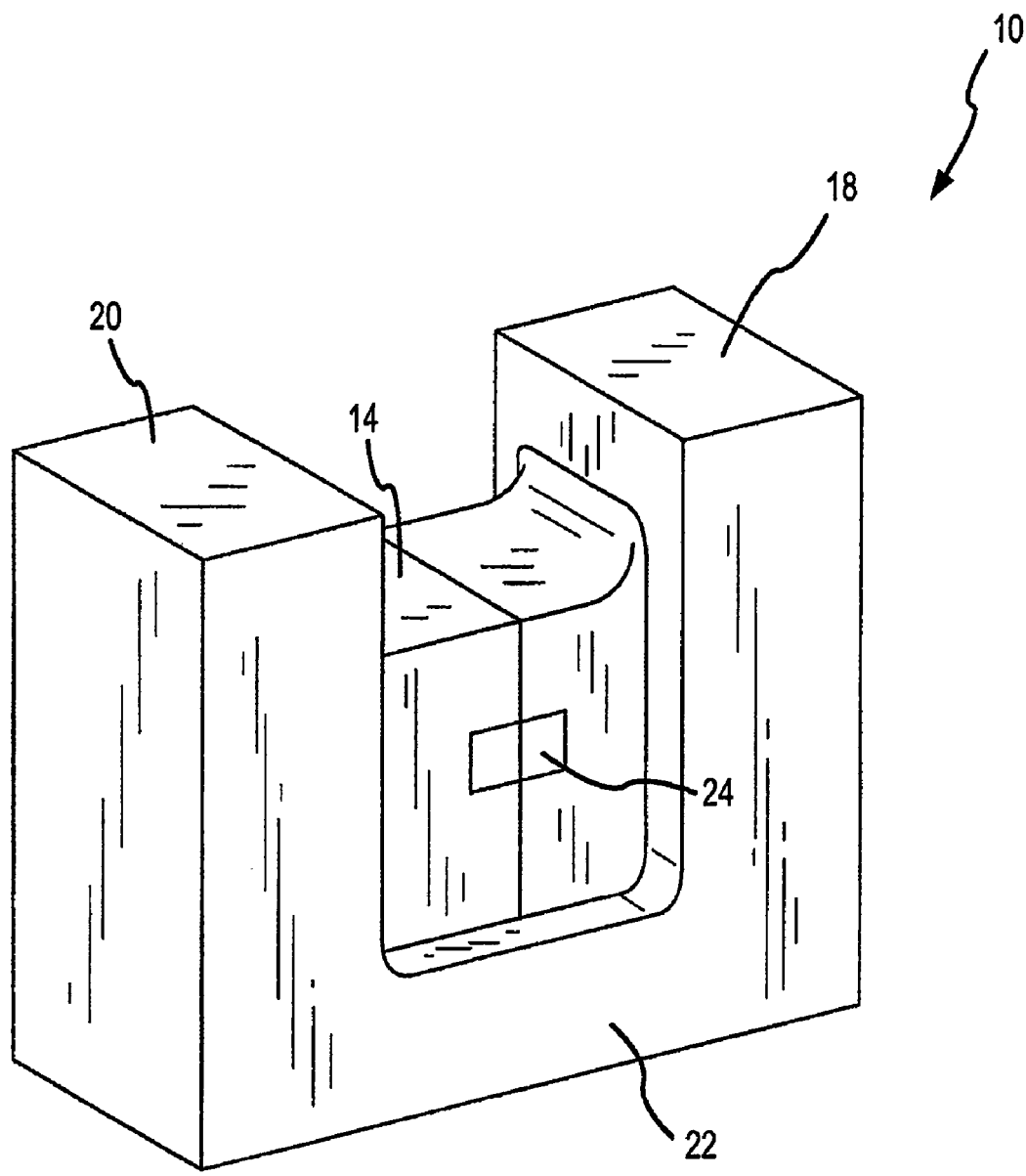
FIG. 1 is an isometric view of a prior art FinFet device.
Figure 2:
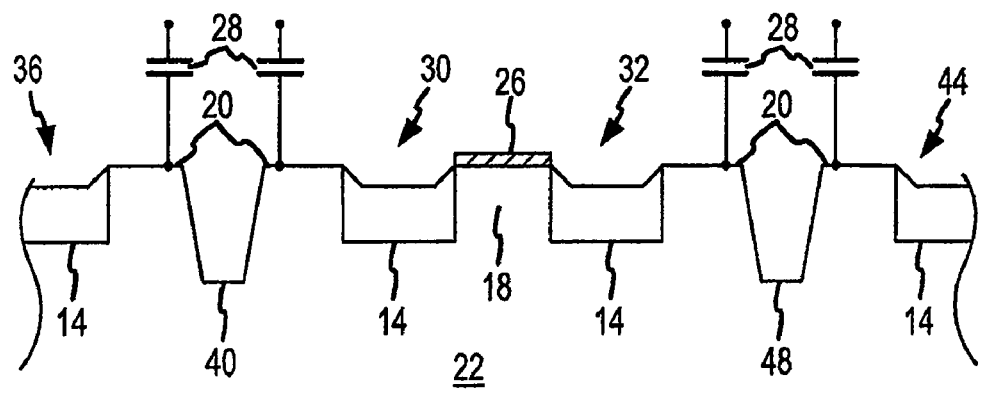
FIG. 2 is cross-sectional view showing a prior art structure for using FinFET devices as access transistors in dynamic random access memory devices.
Figure 3:
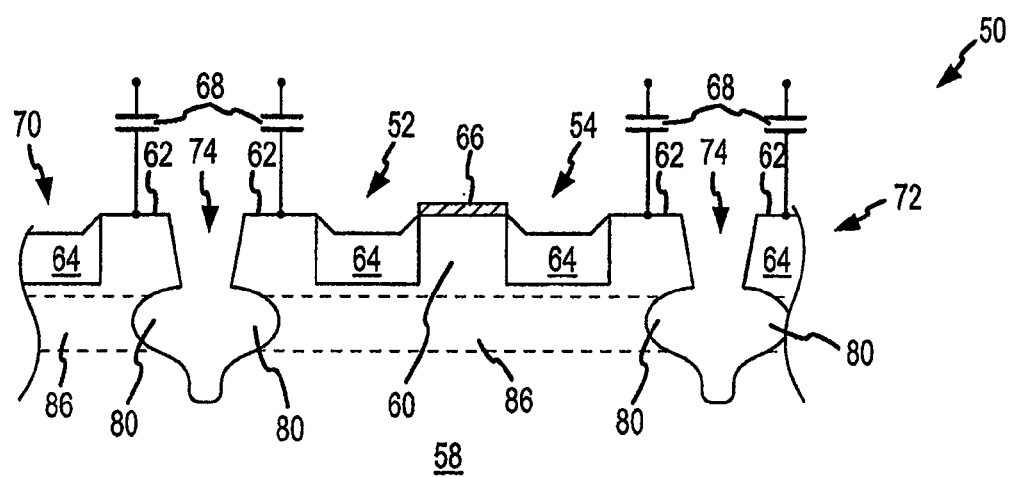
FIG. 3 is cross-sectional view showing a structure for using FinFET devices as access transistors in dynamic random access memory devices according to one embodiment of the invention.

One embodiment of a semiconductor structure 50 using two FinFET devices 52, 54 for connecting respective memory cell capacitors (not shown) to a digit line (not shown) is shown in FIG. 3. The FinFET devices 52, 54, like the FinFET devices 30, 32 shown in FIG. 2, have fabricated on a body 58 of semiconductor material a common drain pillar 60 connected to respective source pillars 62 through respective fins 64. The drain pillar 60 is connected to a digit line conductor 66, and the source pillars 62 are connected to respective memory cell capacitors 68. The FinFET devices 52, 54 also include shallow isolation trenches 74 separating the source pillars 62 of the FinFET devices 52, 54 from the source pillars 62 of adjacent FinFET devices 70, 72, respectively.

The drain pillar 60 is connected to a common digit line 66. The source pillars 62 of the FinFET devices 52, 54, 70, 72 are connected to respective memory cell capacitors 68. Unlike the STI structures 40 used in the prior art structure of FIG. 2, the isolation trenches 74 having laterally extending cavities 80 formed therein. The cavities 80 extend under the source pillars 62 of the FinFET devices 52, 54, 70, 72. Cavities 86 are also formed under the fins 64 of the FinFET devices 52, 54, 70, 72.

The cavities 80, 86 reduce the size of any possible conduction path from the fins 64 to the body 58, and they also reduce the size of any possible conduction path from the source pillars 62 to the body 58. These reductions in the size of any possible conduction paths have the effect of increasing the resistance between the fins 64 and source pillars 62 to the body 58. As a result, the sub-threshold leakage of the FinFET devices 52, 54, 70, 72 are substantially reduced. The FinFET devices 52, 54, 70, 72 are therefore better able to serve as DRAM access transistors.

Figure 4:
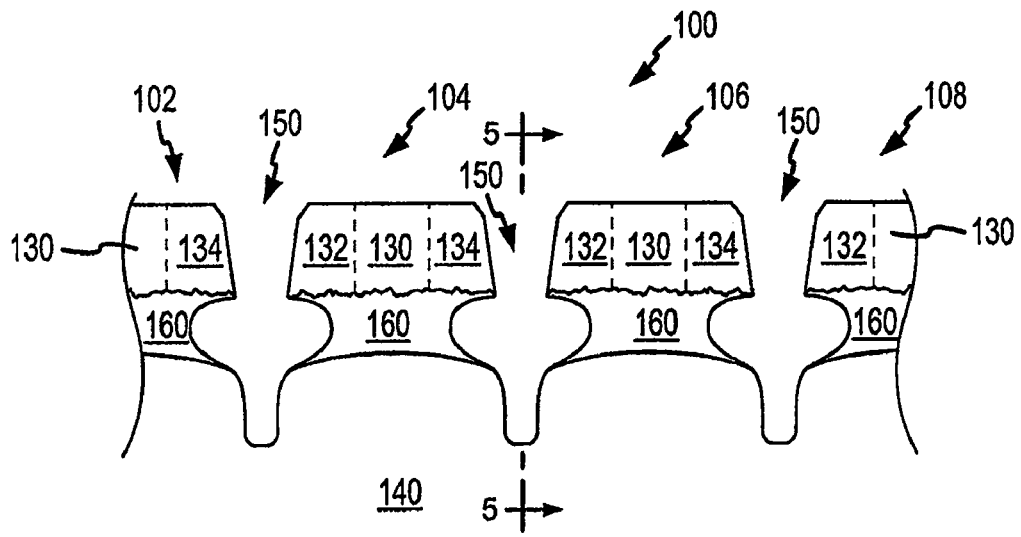
FIG. 4 is a cross-sectional view of a FinFET device according to another embodiment of the invention.
Figure 5:
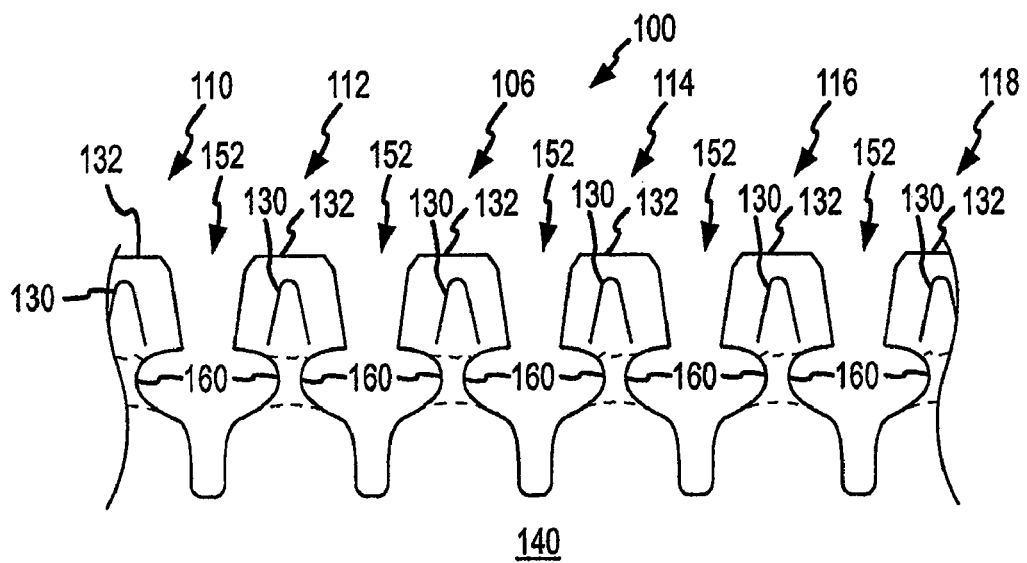
FIG. 5 is a cross-sectional view of the FinFET device of FIG. 4 taken along the line 5-5 of FIG. 4.

Another embodiment of a semiconductor structure 100 using FinFET devices is shown in FIGS. 4 and 5. FIG. 4 shows several FinFET devices 102, 104, 106, 108 in the same orientation in which the FinFET devices 52, 54, 70, 72 are shown in the structure 50 of FIG. 3. FIG. 5 shows the semiconductor structure 100 taken along the line 5-5 of FIG. 4 in which the FinFET device 106 is shown in end view along with end views of adjacent rows of FinFET devices 110, 112, 114, 116, 118. Each of the FinFET devices 102-108 and 110-118 includes a fin 130 extending between a drain pillar 132 and a source pillar 134, all of which are fabricated in a body 140 of semiconductor material. Unlike the FinFET devices 52, 54, 70, 72 of FIG. 3, the drain pillars 132 are not shared by two FinFET devices.

The FinFET devices 102-108 and 110-118 are electrically isolated from each other by a first STI structure 150 (FIG. 4) extending in one direction and a second STI structure 152 (FIG. 5) extending in an orthogonal direction. However, in some embodiments, a single STI structure can extend entirely around the fins 130, drain pillars 132 and source pillars 134 so that the body 140 forms an upwardly projecting pedestal. In either case, a cavity 160 extends laterally from the STI structures 150, 152 partially beneath the fins 130, drain pillars 132 and source pillars 134. As explained above, the cavities 160 reduce in the size of any possible conduction paths and thus increase the resistance between the fins 130, drain pillars 132 and source pillars 134 to the body 140.

Figure 6:
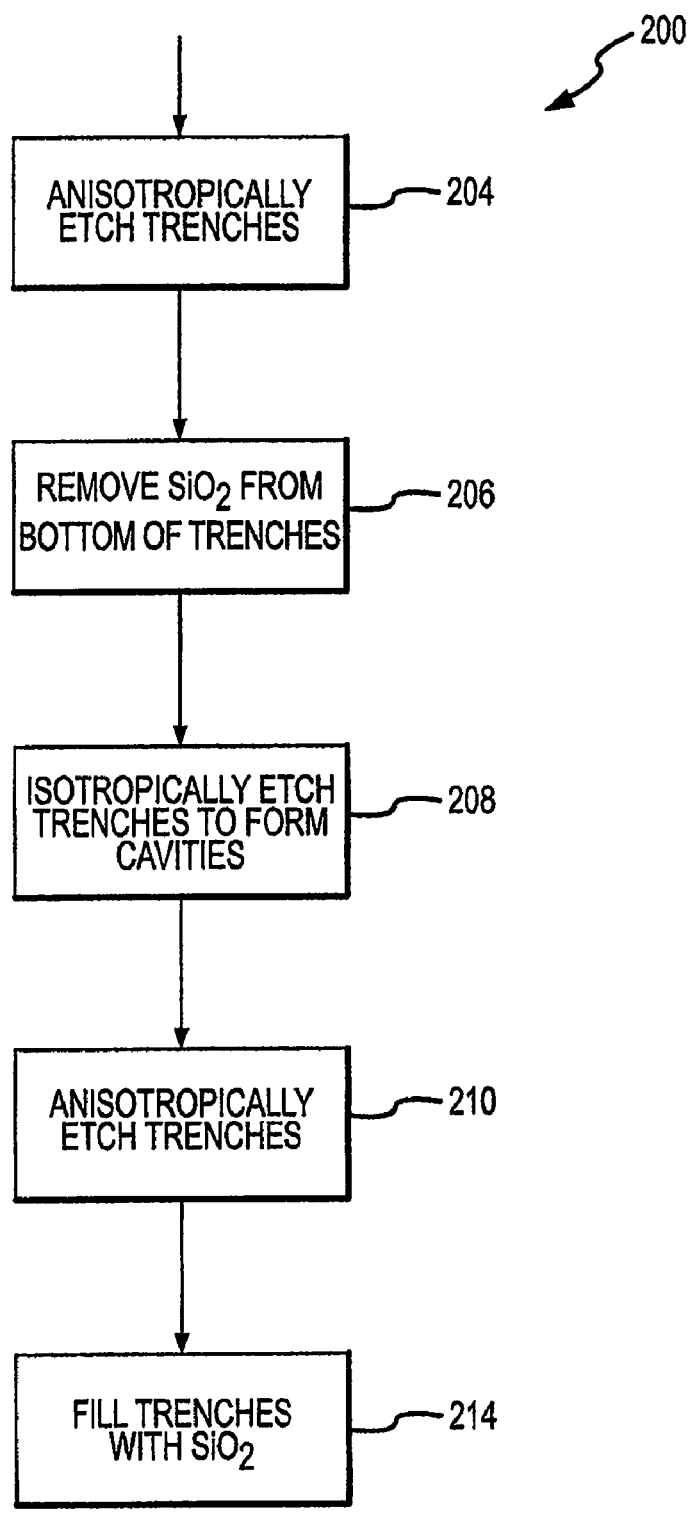
FIG. 6 is a flow chart showing one embodiment of a process for fabricating the semiconductor structures of FIGS. 3-5 or a semiconductor structure according to some other embodiment of the invention.

The semiconductor structures 50, 100 may be fabricated using a variety of methods. One embodiment of a process 200 for fabricating the semiconductor structures 50, 100 is shown in FIG. 6. The process 200 first includes anisotropically etching the STI structures 74 and 150, 152 at step 204 to a level that is approximately equal to the upper edge of the cavities 80, 160. This step 204 forms relatively smooth wall trenches of relatively constant width. During the etching process, silicon dioxide $SiO_2$ is formed on the wall of the trenches. The $SiO_2$ is left on the walls of the trench, but the $SiO_2$ is preferably removed from the bottom of the trenches at step 206. The $SiO_2$ is left on the walls of the trench for the next step 208 to serve as a mask. During this next step 208, the cavities 80, 160 are formed by isotropic etching. The $SiO_2$ mask on the walls of the trench protect them from further etching, but the bottom of the trench is etched in an isotropic manner to form the cavities 80, 160. The trenches are anisotropically etched again at step 210 to form the portions of the STI structures 74, 150 extending beyond the cavities 80, 160, respectively. Finally, trenches are filled in with $SiO_2$ by conventional means at step 214. The remaining structures of the FinFET devices, including the fins, are then subsequently fabricated by conventional means.

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:
1. A semiconductor device comprising:
a semiconductor substrate;
opposed source and drain pillars fabricated in the semiconductor substrate;
a fin fabricated in the semiconductor substrate and interposed between the source and drain pillars; and
a cavity formed in the semiconductor substrate, the cavity extending laterally and at least partially extending beneath at least one of the source pillar, the drain pillar or the fin.
2. The semiconductor device of claim 1 wherein the cavity extends continuously around the fin and the source and drain pillars.
3. The semiconductor device of claim 1 wherein the cavity extends at least partially between the fin and the semiconductor substrate at opposite sides of the fin.
4. The semiconductor device of claim 1 the cavity having a first wall proximal the first pillar of a first FinFET and a second wall proximal the second pilar of a second FinFET, wherein the first wall and second wall are substantially orthogonal to the surface.
5. The semiconductor device of claim 1 the cavity having a first wall proximal the first pillar of a first FinFET and a second wall proximal the second pilar of a second FinFET, wherein the first wall and second wall are slanted with respect to the substrate's surface.
6. The semiconductor device of claim 1 wherein the cavity comprises a first region proximal a surface of the substrate having substantially vertical walls separated by a first distance, a second region proximal to the first region having substantially annular walls extending laterally inwardly and away from the cavity, thereby proscribing a shape of proximately circular shape with a diameter which is greater than the first distance, and a third region having substantially vertical walls, separated by a second distance.
7. The semiconductor device of claim 6 wherein the first distance is greater than the second distance.
8. The semiconductor device of claim 6 wherein the second distance is at least equal to the first distance.
9. The semiconductor device of claim 1, further comprising a memory cell capacitor electrically coupled to the source pillar.
10. The semiconductor device of claim 1 wherein the first cavity extends at least partially beneath the second pillar between the second fin and the semiconductor substrate.

11. A semiconductor device for use as an access transistor in a dynamic random access memory, the semiconductor device comprising:
- a semiconductor substrate;
- a first pillars fabricated in the semiconductor substrate and coupled to a digit line;
- a second pillar fabricated in the semiconductor substrate and coupled to a first memory cell capacitor;
- a first fin fabricated in the semiconductor substrate and interposed between the first pillar and the second pillar;
- a first cavity formed in the semiconductor substrate, the first cavity extending laterally and at least partially extending beneath at least one of the first pillar, the second pillar or the first fin;
- a third pillar fabricated in the semiconductor substrate and coupled to a second memory cell capacitor;
- a second fin fabricated in the semiconductor substrate and interposed between the first pillar and the third pillar; and
- a second cavity formed in the semiconductor substrate, the second cavity extending laterally and at least partially extending beneath at least one of the third pillar or the second fin.

12. The semiconductor device of claim 11 wherein the first cavity extends at least partially between the first fin and the semiconductor substrate at opposite sides of the first fin, and the second cavity extends at least partially between the second fin and the semiconductor substrate at opposite sides of the second fin.

13. The semiconductor device of claim 11 wherein a first pillar, second pillar, and first fin form a FinFET.

14. The semiconductor device of claim 11 wherein the first cavity is configured to reduce a size of a conduction path from the first fin to the semiconductor substrate.

15. The semiconductor device of claim 11 wherein the first cavity is configured to increase resistance between the first fin and the semiconductor substrate.

16. The semiconductor device of claim 11 wherein the first and second cavities are formed in the semiconductor substrate by an anisotropic etch followed by an isotropic etch.

17. The semiconductor device of claim 11 wherein the first pillar comprises a common drain pillar for first and second FinFETs formed from the second and third pillars and the first and second fins.

18. The semiconductor device of claim 11, further comprising a shallow trench isolation structure, the shallow trench isolation structure including the first cavity.

19. The semiconductor device of claim 11, further comprising a dielectric material formed within the first cavity.

* * * * *

UNITED STATES PATENT AND TRADEMARK OFFICE
CERTIFICATE OF CORRECTION

PATENT NO.         : 8,022,473 B2                                       Page 1 of 1
APPLICATION NO.    : 13/029038
DATED              : September 20, 2011
INVENTOR(S)        : David K. Hwang et al.

It is certified that error appears in the above-identified patent and that said Letters Patent is hereby corrected as shown below:

In column 4, line 41, in Claim 4, delete "pilar" and insert -- pillar --, therefor.

In column 4, line 46, in Claim 5, delete "pilar" and insert -- pillar --, therefor.

In column 5, line 5, in Claim 11, delete "pillars" and insert -- pillar --, therefor.

Signed and Sealed this
Twenty-ninth Day of November, 2011

David J. Kappos
*Director of the United States Patent and Trademark Office*